US010620355B2

(12) United States Patent
Maggiali et al.

(10) Patent No.: US 10,620,355 B2
(45) Date of Patent: Apr. 14, 2020

(54) DISPLAY INCLUDING A PLURALITY OF LIGHT SOURCES AND A PLURALITY OF WAVEGUIDES

(71) Applicant: FONDAZIONE ISTITUTO ITALIANO DI TECNOLOGIA, Genoa (IT)

(72) Inventors: Marco Maggiali, Genoa (IT); Giorgio Metta, Genoa (IT)

(73) Assignee: FONDAZIONE ISTITUTO ITALIANO DI TECNOLOGIA (IT)

( * ) Notice: Subject to any disclaimer, the term of this patent is extended or adjusted under 35 U.S.C. 154(b) by 0 days.

(21) Appl. No.: 16/308,571

(22) PCT Filed: Jun. 20, 2017

(86) PCT No.: PCT/IB2017/053658
§ 371 (c)(1),
(2) Date: Dec. 10, 2018

(87) PCT Pub. No.: WO2017/221147
PCT Pub. Date: Dec. 28, 2017

(65) Prior Publication Data
US 2019/0154902 A1 May 23, 2019

(30) Foreign Application Priority Data
Jun. 20, 2016 (IT) .......................... 102016000063390

(51) Int. Cl.
*G02B 6/06* (2006.01)
*G02B 6/08* (2006.01)
(Continued)

(52) U.S. Cl.
CPC ......... *G02B 6/0008* (2013.01); *G02B 6/0006* (2013.01); *G02B 6/06* (2013.01);
(Continued)

(58) Field of Classification Search
None
See application file for complete search history.

(56) References Cited

U.S. PATENT DOCUMENTS 5,465,315 A * 11/1995 Sakai ....................... G02B 6/06
  385/116
6,215,593 B1 * 4/2001 Bruce ....................... G02B 6/08
  359/619

(Continued)

FOREIGN PATENT DOCUMENTS

KR   20120069459   6/2012
WO   2014/205999   12/2014

OTHER PUBLICATIONS

International Search Report and Written Opinion corresponding to International Patent Application No. PCT/IB2017/053658, dated Oct. 12, 2017.

*Primary Examiner* — Michelle R Connelly
(74) *Attorney, Agent, or Firm* — McAndrews, Held & Malloy, Ltd.

(57) ABSTRACT

A display including: a plurality of light sources that emit light beams; a plurality of optical cores having an elongated shape, each optical core having a respective first end, which is optically coupled to a corresponding light source, each optical core further being such that the light beam emitted from the corresponding light source propagates in a guided manner inside the optical core; and a screen, each optical core having a respective second end, which is optically coupled to the screen. The display further includes an optical separation element, which forms a plurality of cavities that house corresponding optical cores, each cavity and the corresponding optical core forming a corresponding waveguide. The optical separation element absorbs visible light and laterally surrounds at least the first end of each optical core.

11 Claims, 2 Drawing Sheets

(51) Int. Cl.
    *G02B 6/42* (2006.01)
    *H01L 33/58* (2010.01)
    *F21V 8/00* (2006.01)
    *G02F 1/13357* (2006.01)
    *G06F 1/16* (2006.01)
    *H01L 27/15* (2006.01)
    *H01L 25/075* (2006.01)

(52) U.S. Cl.
    CPC ......... *G02B 6/4249* (2013.01); *G02F 1/1336* (2013.01); *G06F 1/1652* (2013.01); *H01L 27/156* (2013.01); *H01L 33/58* (2013.01); *H01L 25/0753* (2013.01)

(56) References Cited

U.S. PATENT DOCUMENTS

| | | | |
|---|---|---|---|
| 2002/0031316 A1 | 3/2002 | Lowry | |
| 2005/0286846 A1* | 12/2005 | Bayley | G02B 6/06 385/116 |
| 2007/0279367 A1 | 12/2007 | Kitai | |
| 2009/0322987 A1* | 12/2009 | Dunn | G02F 1/133524 349/65 |
| 2013/0278872 A1 | 10/2013 | Teller et al. | |

* cited by examiner

DISPLAY INCLUDING A PLURALITY OF LIGHT SOURCES AND A PLURALITY OF WAVEGUIDES

The present application is filed pursuant to 35 U.S.C. 371 as a U.S. National Phase application of International Application No. PCT/IB2017/053658, which was filed on Jun. 20, 2017, and claims priority to Italian Application No. 102016000063390, which was filed on Jun. 20, 2016. The entire text of the aforementioned applications are incorporated by reference in their entirety.

TECHNICAL FIELD

The present invention relates to a display that includes a plurality of light sources and a plurality of waveguides.

BACKGROUND ART

As is known, numerous types of display exist nowadays, these generally being optoelectronic systems that include a screen on which, for example, alphanumeric data can be displayed in the form of luminous characters. Typically, displays find wide use in calculators, portable electronic devices and video units.

Historically, displays have been characterized by having flat types of screen, such as in the case of the structure described in US 2007/0279367 for example, which comprises a liquid crystal display.

Recently, curved and even flexible displays have been proposed. An example of a curved display is described in US 20160018852.

In general, the definition of the screen's pixels, i.e. the luminous dots of the screen, can become difficult with a curved display. In fact, it is possible that the irradiated light associated with a single pixel mixes with the irradiated light associated with one or more adjacent pixels; in consequence, it is possible that an observer perceives the pixels as being blurred. In practice, it is possible that the optical quality of the images that are formed on the screen is reduced.

DISCLOSURE OF INVENTION

The object of the present invention is therefore to provide a display that at least partly overcomes the drawbacks of the known art.

According to the invention, a display is provided as defined in the appended claims.

BRIEF DESCRIPTION OF THE DRAWINGS

For a better understanding of the invention, some embodiments will now be described, purely by way of a non-limitative example and with reference to the accompanying drawings, in which.

BEST MODE FOR CARRYING OUT THE INVENTION

Figure 1:
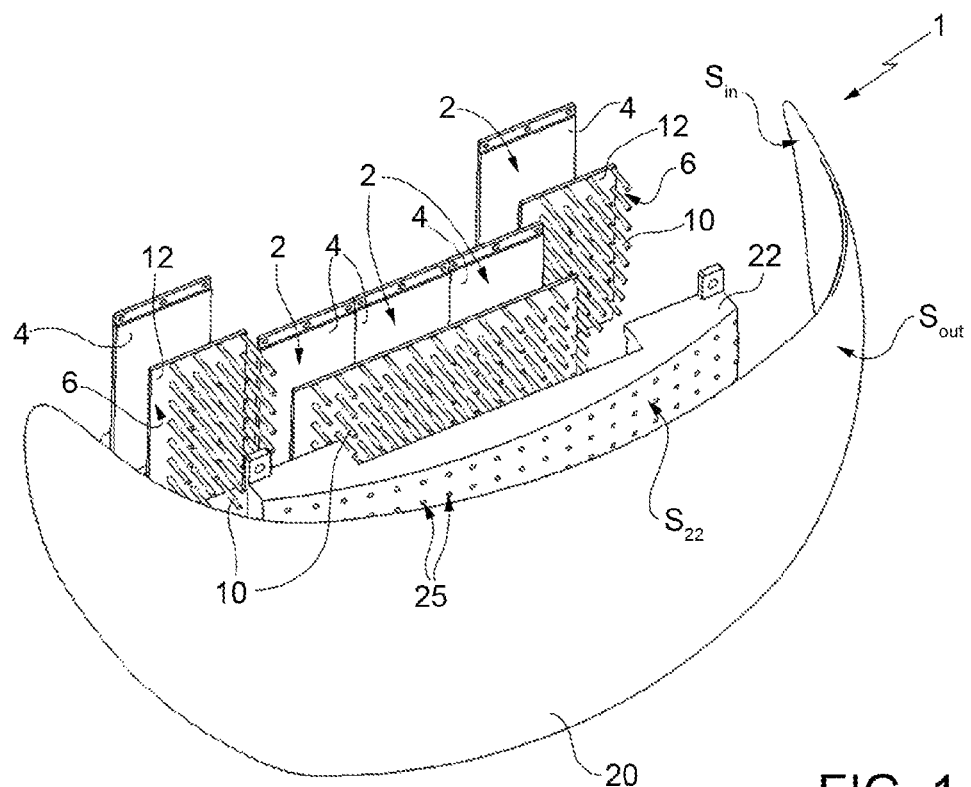
FIG. 1 shows an exploded perspective view of the display.

FIG. 1 shows a display 1 that, purely by way of example, comprises five illumination modules 2.

Each illumination module 2 comprises a respective optoelectronic board 4 and a respective guide module 6 (for viewing simplicity, only two guide modules are indicated with the respective reference numeral in FIG. 1).

Figure 2:
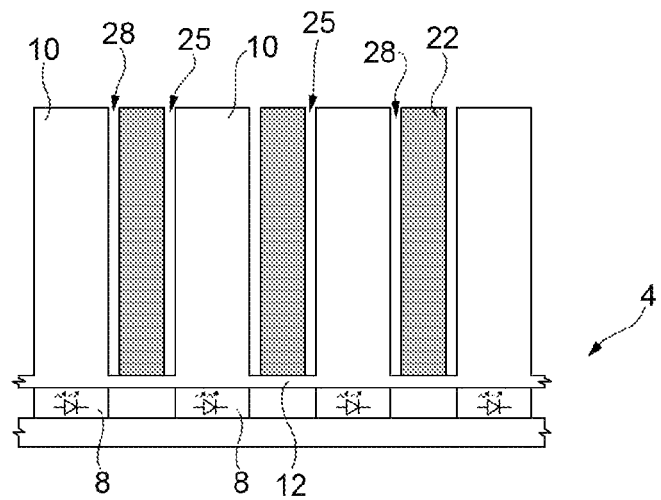
FIGS. 2, 3 and 5 schematically show cross-sections of portions of embodiments of the display.

As shown in FIG. 2, each optoelectronic board 4 comprises a plurality of respective light sources 8, which are arranged in a planar manner, for example so as to form a matrix. Without any loss of generality, each light source 8 is formed, for example, by a LED diode of the so-called RGB type (red-blue-green). Each light source 8 is therefore capable of generating a respective optical beam, modulating the amount of light in the red, blue and green bands in an electrically controllable manner.

Each guide module 6 includes a plurality of respective optical elements (indicated by reference numeral 10) apt to host the guided propagation of visible light, which shall hereinafter be referred to as the optical cores 10. Without any loss of generality, in the embodiment shown in FIGS. 1 and 2, the optical cores 10 are formed of a transparent plastic material (for example, polymethyl methacrylate, also known as PMMA), extending along a same direction and having a cylindrical shape with a longitudinal axis that coincides with the aforementioned direction of extension; for example, the cylinder may have a circular base with a diameter ranging between 1.5 mm and 2.2 mm.

Each guide module 6 comprises a supporting structure 12, which is fixed to the corresponding optical cores 10 and is such that the optical cores 10 are integral with each other. In turn, the supporting structure 12 is fixed to the corresponding optoelectronic board 4 in a manner such that the optical cores 10 of each guide module 6 are fixed with respect to the light sources 8 of the corresponding optoelectronic board 4.

In particular, in the embodiment shown in FIGS. 1 and 2, the supporting structure 12 has the shape of a slab made of the same material that forms the optical cores 10; furthermore, the optical cores 10 depart from the same side of the slab, which is the opposite one with respect to a side facing the light sources 8. Even more specifically, in this embodiment the slab that forms the supporting structure 12 is made in one piece with the optical cores 10. From another point of view, the optical cores 10 depart from the supporting structure 12, which has a planar shape.

The display 1 also comprises a screen 20 and a further optical element 22, which shall hereinafter be referred to as the optical separation element 22.

In detail, given an illumination module 2, each optical core 10 of the respective guide module 6 has a first and a second end. The first end contacts the slab that forms the corresponding supporting structure 12 and is optically coupled to a corresponding light source 8 of the corresponding optoelectronic board 4, so as to receive the optical beam generated by it, while the second end is optically coupled to the screen 20 in such a way that the optical beam is directed onto the screen 20, after it has propagated along the optical core 10.

The screen 20 is delimited by an inner surface $S_{in}$, which faces towards the guide modules 6, and an outer surface $S_{out}$, which faces outwards. Without any loss of generality, the screen 20 defines an inward facing cavity, i.e. the inner surface $S_{in}$ and the outer surface $S_{out}$ are concave and convex, respectively. Always without any loss of generality, the screen 20 includes a central portion, having a first radius of curvature, and at least two peripheral portions, which are arranged on opposite sides of the central portion and have, at least locally, smaller radii of curvature than the first radius of curvature.

Purely by way of example, the screen 20 is made of dark plexiglass with a gloss finish. In other words, in a first approximation, the inner surface $S_{in}$ and the outer surface $S_{out}$ are not rough; therefore, assuming that direct light strikes the inner surface $S_{in}$, i.e. light capable of generating images, then direct light is still present on the outer surface $S_{out}$, even if with lesser intensity. Thus, in a first approximation, the screen 20 does not cause any diffusion process of the light passing through it; equivalently, the screen 20 is transparent, i.e. of the see-through type.

Always without any loss of generality, the illumination modules 2 might not be coplanar to each other; in particular, each of them could be at a different respective distance from the screen 20, so as to reduce the length of the respective optical cores 10.

The optical separation element 22 is interposed between the inner surface $S_{in}$ of the screen 20 and the guide modules 6.

In detail, the optical separation element 22 is formed, for example, by synthetic polymers (for example, aliphatic or aromatic polyamides) or crystalline polymers (for example, polyoxymethylene) and is black. Furthermore, the optical separation element 22 forms a plurality of through type cavities 25, which have a cylindrical shape, this cylindrical shape having a diameter larger than the diameter of the optical cores 10.

Each cavity 25 houses a corresponding optical core 10; furthermore, without any loss of generality, the longitudinal axes of the cavity 25 and the corresponding optical core 10 are coincident. With regard to the shape of the cavity 25 and, more generally, of the optical separation element 22, FIG. 2 is not consistent with that shown in FIG. 1 for motives of simplicity.

In greater detail, there is an annular-shaped gap 28 between each cavity 25 and the corresponding optical core 10; in a plane perpendicular to the longitudinal axes of the optical cores 10, the gap 28 has the shape of an annulus. The gap 28 is delimited by an (external) wall formed by the optical separation element 22 and by the side wall of the corresponding optical core 10. Air is present inside the gaps 28.

From an optical standpoint, given any optical core 10, the corresponding gap 28 forms a kind of cladding. In fact, the index of refraction of the optical core 10 is higher than the index of refraction of air, and therefore the light can propagate in a guided manner in the optical core 10. From another standpoint, the optical core 10 and the gap 28 form a waveguide having the shape of a (multimodal) optical fibre, the core of which is formed precisely by the optical core 10.

Since the optical separation element 22 is black, it does not reflect any light that might escape from the optical cores 10, thus preventing undesired coupling between light that propagates in different optical cores. In other words, the optical separation element 22 is optically absorbent in the visible spectrum (400 nm-700 nm), in such a way that, in a first approximation, each cavity 25 is optically decoupled from the other cavities 25.

Even more specifically, the optical separation element 22 (laterally) surrounds the first end of each optical core 10 and, without any loss of generality, extends for the entire length of each optical core 10, uninterruptedly surrounding also the corresponding second end. Furthermore, given a guide module 6, the optical separation element 22 contacts the slab that forms the supporting structure 12.

Operatively, as previously mentioned, each light source 8 generates its own optical beam, which, after propagating through the corresponding optical core 10, impinges onto the inner surface $S_{in}$ of the screen 20 and forms a corresponding luminous area on the outer surface $S_{out}$, which shall hereinafter be referred to as a luminous dot. The shape of the luminous dot depends on the curvature of the screen 20 at the luminous dot. For example, assuming a light source with a square emission area, it is possible that the corresponding luminous dot has an elliptical shape, without it being necessary to resort to lenses.

With regard to the coupling between the light sources 8 and the optical cores 10, the presence of the supporting structure 12 does not entail, in a first approximation, any undesired light mixing, i.e. does not entail light emitted by a light source 8 being coupled with an optical core 10 other than its own optical core 10. This is due to the fact that the supporting structure 12 has a reduced thickness, measured along the direction of extension of the optical cores 10. For example, the supporting structure 12 has a thickness of no more than 0.5 mm; the optical cores 10 instead have a length (measured along the direction of extension), for example, ranging between 5 mm and 25 mm. More generally, the length of each supporting structure 12 parallel to the longitudinal axes of the optical cores 10 is preferably no more than 10%, even more preferably 5% of the length of the shortest optical core connected thereto.

The fact that the first ends of the optical cores 10 are entirely surrounded by the optical separation element 22 limits the possibility that optical coupling occurs between an optical core 10 and undesired light such as, for example, light coming from light sources other than the light source 8 associated with the optical core 10. Furthermore, the fact that the optical cores 10 are surrounded by the optical separation element 22 for their entire length enables reducing optical coupling between the optical cores 10 and ambient light; this latter phenomenon would make the optical cores 10 visible to a user in front of the screen 20, reducing the sharpness of the display 1. In this regard, thanks to the presence of the optical separation element 22, the display 1 appears substantially black when turned off.

From a more quantitative standpoint, the fact that the optical cores 10 are surrounded by the optical separation element 22 for their entire length means that, assuming an xyz orthogonal reference system where the z-axis is parallel to the longitudinal axes of the optical cores 10, each point of an optical core 10 is entirely surrounded, in the xy-plane, by the optical separation element 22. All the same, satisfactory results can also be achieved in the case where, given any optical core 10, the optical separation element 22 uninterruptedly and laterally surrounds a portion of this optical core 10 that includes the first end and has a length equal to 50%, preferably 70%, and even more preferably 95% of the length of the entire optical core 10.

Referring again to the embodiment shown in FIG. 1, and considering any guide module 6, the portion of the optical separation element 22 that surrounds the second ends of the optical cores 10 is delimited by a respective surface $S_{22}$, which faces the inner surface $S_{in}$ of the screen 20, and which shall hereinafter be referred to as the intermediate surface $S_{22}$. The second end of the optical cores 10 give onto the intermediate surface $S_{22}$; in other words, assuming that the second end of the optical cores 10 form faces with a negligible area, these faces lie substantially along the intermediate surface $S_{22}$. Without any loss of generality, the intermediate surface $S_{22}$ may contact the inner surface $S_{in}$ of the screen 20; furthermore, independently of any contact, one or more portions of the intermediate surface $S_{22}$ have the same radii of curvature as the corresponding portions of the inner surface $S_{in}$, these portions of the inner surface $S_{in}$ being arranged frontally, i.e. arranged aligned along corresponding directions parallel to the longitudinal axes of the optical cores 10, with respect to the corresponding portions of the intermediate surface $S_{22}$. In consequence, in the case of contact, the intermediate surface $S_{22}$ is at least locally tangent to the inner surface $S_{in}$.

In any case, embodiments are possible in which the supporting structures have different shapes. In particular, embodiments (not shown) are possible in which the supporting structures are such as not to optically interact with the optical beams generated by the light sources 8; for example, each supporting structure 12 may be formed be a corresponding lattice. However, the embodiment shown in FIGS. 1 and 2 has the advantage that each guide module 6 can be manufactured inexpensively through the use of a 3D printer.

Figure 3:
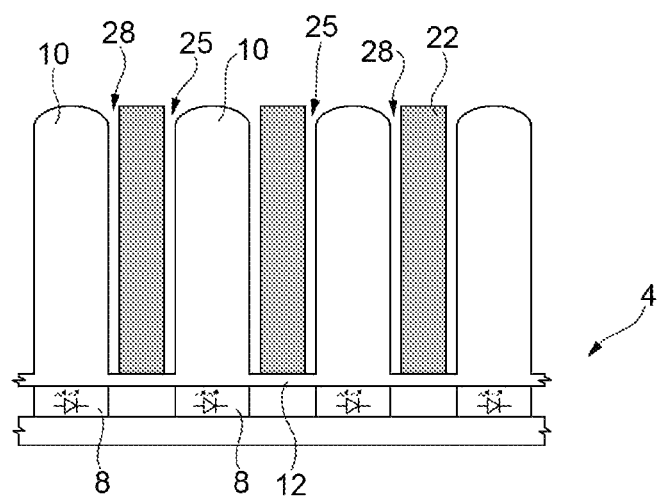

Again, with reference to the optical cores 10, it is possible that the first and the second ends, which act as faces of the aforementioned waveguides, are flat, as shown in FIG. 2. It is also possible that these ends have different shapes; for example, FIG. 3 shows an embodiment in which the second ends of the optical cores 10 are convex, so as to distribute the light emitted by each second end in a more uniform manner.

Independently of possible curvature of the second end, it is also possible that there is non-negligible roughness, so as to ensure that each second end is illuminated in a substantially uniform manner by the corresponding optical beam, even in the case where the optical cores 10 have relatively short lengths.

Figure 4:
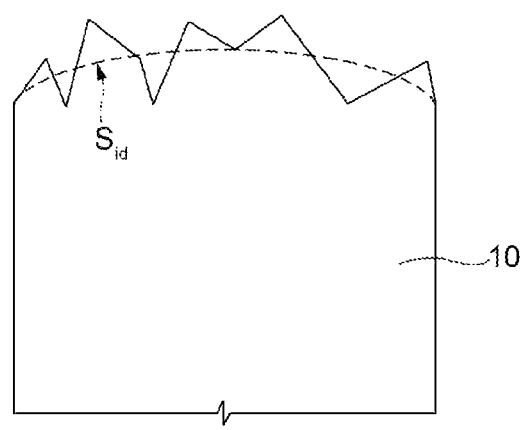
FIG. 4 schematically shows, on an enlarged scale, a cross-section of a portion of an embodiment of the display.

For example, indicating the maximum wavelength of the light emitted by the light sources 8 as $\lambda$ (for example, $\lambda=550$ nm) and considering a cross-section containing the axis of an optical core, the second end may have a profile with a roughness (intended as the average arithmetic value of the deviations, considering the absolute values thereof, with respect to ideal surface $S_{id}$ that the second end would have in the absence of roughness) ranging between $6*\lambda$ and $10*\lambda$, as shown in FIG. 4 for example, with reference to the case in which the second ends of the optical cores 10 are convex.

Figure 5:
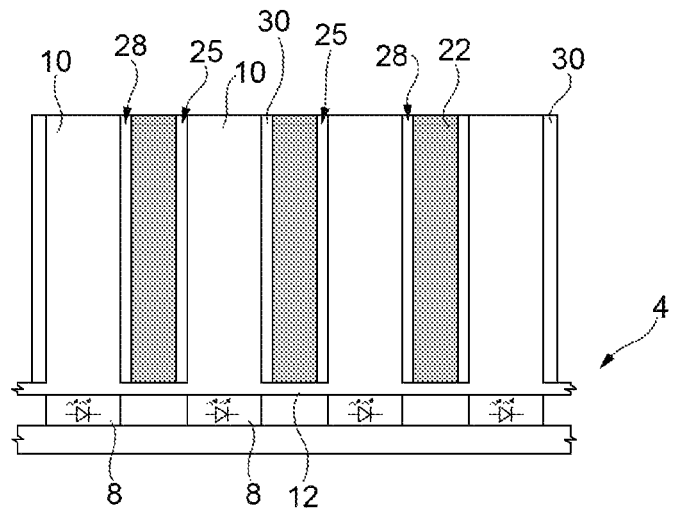

According to the example shown in FIG. 5, each optical core 10 is surrounded by a respective cladding 30, which, without any loss of generality, entirely occupies the corresponding gap 28. Each optical core 10 and the corresponding cladding 30 form an optical fibre.

The advantages that can be achieved with this display clearly emerge from the foregoing description. In particular, this display allows defining the pixels with precision, even in the presence of screen curvatures. Furthermore, as previously mentioned, this display enables determining the shape of the luminous dots without resorting to lenses and has compact dimensions compared, for example, to so-called back-projection systems.

In particular, with regard to embodiments in which the cladding 30 is absent and the related function is performed by the air present in the gap 28 that surrounds each optical core 10, these embodiments are inexpensive, as the optical cores 10 can be formed by extrusion and do not require any coating. In addition, as previously mentioned, the optical cores 10 and the related supporting structure 12 may be monolithic, i.e. they may form a single piece.

Finally, it is clear that modifications and variants may be made to this display without departing from the scope of the present invention, as defined in the appended claims.

For example, the optical cores may be curved, instead of straight (i.e. they may have a longitudinal axis, and hence an axis of symmetry in the case of symmetrical shapes, which is a curved instead of straight).

With regard to the screen 20, this may also be flat.

Regarding the light sources, it is possible that they are different from RGB LEDs; for example, they could be formed by an LCD or OLED screen.

The number and reciprocal arrangement of the illumination modules 2 may vary with respect to that described. For example, it is possible that only one illumination module 2 is present. It is also possible that in the presence of multiple illumination modules 2, two or more illumination modules have components (for example, the respective guide modules 6) forming a single piece, or in any case integral with each other.

Finally, one or both of the inner surface $S_{in}$ and outer surface $S_{out}$ of the screen 20 may be rough, for example, in the case where it is wished to at least partially overlap two or more neighbouring luminous dots.

The invention claimed is:

1. A display including:
a plurality of light sources configured to emit light beams;
a plurality of optical cores having an elongated shape, each optical core having a respective first end, which is optically coupled to a corresponding light source, each optical core being further configured so that, in use, the light beam emitted from the corresponding light source propagates in a guided manner inside the optical core; and
a screen, each optical core having a respective second end, which is optically coupled to said screen;
said display further comprising an optical separation element, which forms a plurality of cavities that house corresponding optical cores, each cavity and the corresponding optical core forming a corresponding gap, said corresponding gap and said corresponding optical core forming a waveguide; and wherein said optical separation element is configured to absorb visible light and laterally surrounds at least the first end of each optical core; and said display being characterized in that it further comprises a supporting structure, which has a planar shape and forms a single piece with the optical cores, the first ends of which are connected to the supporting structure, said supporting structure being optically coupled to the light sources.

2. The display according to claim 1, wherein the optical separation element laterally surrounds a portion of each optical core, which includes the corresponding first end and has a length equal to at least 50% of the length of the optical core.

3. The display according to claim 1, wherein the optical separation element contacts the supporting structure.

4. The display according to claim 1, wherein a portion of the optical separation element is delimited by a surface that faces the screen; and wherein at least one portion of said surface has the same radius of curvature as a corresponding portion of the screen, said screen portion being arranged frontally with respect to said surface portion.

5. The display according to claim 3, wherein the second ends of each optical core give onto said surface.

6. The display according to claim 1, wherein the second end of each optical core is convex.

7. The display according to claim 1, wherein the second end of each optical core is rough.

8. The display according to claim 1, wherein said light sources are arranged on a plane.

9. The display according to claim 1, wherein said screen is curved.

10. The display according to claim 1, wherein said optical cores have a cylindrical shape with a diameter between 1.5 mm and 2.2 mm.

11. The display according to claim 1, wherein said gap contains air.

* * * * *

UNITED STATES PATENT AND TRADEMARK OFFICE
CERTIFICATE OF CORRECTION

PATENT NO. : 10,620,355 B2
APPLICATION NO. : 16/308571
DATED : April 14, 2020
INVENTOR(S) : Marco Maggiali and Giorgio Metta Page 1 of 1

It is certified that error appears in the above-identified patent and that said Letters Patent is hereby corrected as shown below:

On the Title Page

Item (73):
It is currently listed as Fondazione Istituto Italiano Di Technologia.
It should be Fondazione Istituto Italiano Di Tecnologia.

Signed and Sealed this
Twenty-third Day of June, 2020

Andrei Iancu
*Director of the United States Patent and Trademark Office*